(12) United States Patent
Yang et al.

(10) Patent No.: US 8,482,710 B2
(45) Date of Patent: Jul. 9, 2013

(54) LIQUID CRYSTAL DISPLAY AND FABRICATION METHOD THEREOF

(75) Inventors: Joon-Young Yang, Gyeonggi-Do (KR); Jung-Il Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 151 days.

(21) Appl. No.: 12/834,684

(22) Filed: Jul. 12, 2010

(65) Prior Publication Data

US 2010/0277659 A1 Nov. 4, 2010

Related U.S. Application Data

(62) Division of application No. 11/522,322, filed on Sep. 18, 2006, now Pat. No. 7,763,481.

(30) Foreign Application Priority Data

Dec. 27, 2005 (KR) .......................... 10-2005-0131007

(51) Int. Cl.
*G02F 1/1333* (2006.01)

(52) U.S. Cl.
USPC .......................................................... 349/138

(58) Field of Classification Search
USPC ........ 349/138, 42–43, 46; 438/151, 158–159; 257/59, 72
See application file for complete search history.

(56) References Cited

U.S. PATENT DOCUMENTS

| | | | |
|---|---|---|---|
| 5,127,330 A | | 7/1992 | Okazaki et al. |
| 5,510,278 A | * | 4/1996 | Nguyen et al. ................ 438/158 |
| 7,016,007 B2 | | 3/2006 | Chang et al. |
| 7,112,512 B2 | * | 9/2006 | Lan et al. ...................... 438/430 |
| 7,241,648 B2 | | 7/2007 | Huang |
| 8,077,266 B2 | * | 12/2011 | Nakamura et al. .............. 349/43 |
| 2002/0140895 A1 | | 10/2002 | Kimura et al. |
| 2004/0095544 A1 | | 5/2004 | Chang et al. |
| 2004/0241987 A1 | | 12/2004 | Kim et al. |
| 2005/0001967 A1 | * | 1/2005 | Chae et al. ..................... 349/139 |
| 2005/0077524 A1 | * | 4/2005 | Ahn et al. ......................... 257/72 |
| 2005/0099579 A1 | * | 5/2005 | Yoo et al. ...................... 349/155 |
| 2006/0097260 A1 | * | 5/2006 | Huang ............................ 257/66 |
| 2006/0132665 A1 | | 6/2006 | Park |
| 2006/0146245 A1 | | 7/2006 | Ahn et al. |

FOREIGN PATENT DOCUMENTS

| | | |
|---|---|---|
| CN | 1499271 A | 5/2004 |
| JP | 2002-62543 A | 2/2002 |
| JP | 2005-157016 A | 6/2005 |
| JP | 2005-321781 A | 11/2005 |
| JP | 2006-140497 A | 6/2006 |

(Continued)

*Primary Examiner* — Bumsuk Won
*Assistant Examiner* — Charles Chang
(74) *Attorney, Agent, or Firm* — Birch, Stewart, Kolasch & Birch, LLP

(57) ABSTRACT

A liquid crystal display and a fabricating method thereof are provided. The liquid crystal display includes a first substrate having a pixel portion and a pad portion; a gate line and a data line crossing each other to define the pixel portion at the pixel portion; a transistor adjacent to a crossing of the gate line and the data line, the transistor including a gate electrode, a source electrode and a drain electrode; an insulating layer above the source electrode and the drain electrode, the insulating layer exposing a lateral side of the drain electrode; a pixel electrode in contact with the lateral side of the drain electrode; a second substrate attached to the first substrate; and a liquid crystal layer between the first substrate and a second substrate.

16 Claims, 19 Drawing Sheets

FOREIGN PATENT DOCUMENTS

| | | |
|---|---|---|
| KR | 10-2002-0000921 A | 1/2002 |
| KR | 10-2002-0036023 A | 5/2002 |
| KR | 10-2004-0041491 A | 5/2004 |
| TW | 240111 B | 9/2005 |

* cited by examiner

LIQUID CRYSTAL DISPLAY AND FABRICATION METHOD THEREOF

CROSS-REFERENCE TO RELATED APPLICATIONS

This application is a Divisional of U.S. application Ser. No. 11/522,322 filed Sep. 18, 2006 now U.S. Pat. No. 7,763,481, which claims priority under 35 U.S.C. §119(a) on Patent Application No. 10-2005-0131007 filed in Korea on Dec. 27, 2005, the entire contents of each are hereby incorporated by reference.

BACKGROUND OF THE INVENTION

1. Field of the Invention

The present invention relates to a liquid crystal display (LCD) and its fabrication method, and more particularly, to an LCD fabricated by a simplified fabrication method to improve the production yield and picture quality of the LCD by reducing the number of masks.

2. Description of the Related Art

Recently, as the users' interest in information displays is growing and the demand for portable (mobile) information devices is increasing, research and commercialization of light and thin flat panel displays (FPD) to replace the existing display device, i.e., CRT (Cathode Ray Tube), are actively ongoing.

Among FPDs, the LCD, a device for displaying images by using optical anisotropy of liquid crystal materials, provides excellent resolution, color, and picture quality. Therefore, the LCD is widely used for notebook computers or desktop monitors and the like.

The LCD includes a color filter substrate (a first substrate), an array substrate (a second substrate), and a liquid crystal layer formed between the color filter substrate and the array substrate.

Generally, thin film transistors (TFTs) are used as switching elements of the LCD, and an amorphous silicon thin film is used as a channel layer of the TFT.

The fabrication process of the LCD requires a plurality of masking processes (namely, photolithography processes) to fabricate the array substrate including the TFTs. Therefore, a method for reducing the number of masking processes is necessary in terms of productivity.

The structure of a general LCD will be described in detail with reference to FIG. 1.

FIG. 1 is an exploded perspective view showing a general LCD.

As shown in FIG. 1, the LCD includes a color filter substrate 5, an array substrate 10 and a liquid crystal layer 30 formed between the color filter substrate 5 and the array substrate 10.

The color filter substrate 5 includes color filters (C) having a plurality of sub-color filters 7 implementing red, green and blue colors, a black matrix 6 for separating the sub-color filters 7 and blocking light transmission to the liquid crystal layer 30, and a transparent common electrode 8 for applying a voltage to the liquid crystal layer 30.

The array substrate 10 includes a plurality of gate lines 16 and a plurality of data lines 17 crossing each other to define a plurality of pixel regions (P), TFTs formed at each crossing of the gate lines 16 and the data lines 17, and pixel electrodes 18 formed on each pixel region (P).

The color filer substrate 5 and the array substrate 10 are attached to each other by a sealant (not shown) formed at an outer edge of an image display region, and the two substrates 5 and 10 are attached by an attachment key (not shown) formed on the color filter substrate 5 or the array substrate 10.

FIGS. 2A to 2E are sectional views sequentially showing a fabrication process of the array substrate of the LCD in FIG. 1.

As shown in FIG. 2A, a gate electrode 21 made of a conductive material is formed by using a photolithography process (a first masking process) on a substrate.

Next, as shown in 2B, a first insulation film 15A, an amorphous silicon thin film and an n+ amorphous silicon thin film are sequentially deposited on the entire surface of the substrate 10 with the gate electrode 21 formed thereon, and the amorphous silicon thin film and the n+ amorphous silicon thin film are selectively patterned by using another photolithography process (a second masking process) to form an active pattern 24 of the amorphous silicon thin film on the gate electrode 21.

Here, the n+ amorphous silicon thin film pattern 25 which has been patterned in the same form as the active pattern 24 is formed on the active pattern 24.

Thereafter, as shown in FIG. 2C, a conductive metal material is deposited on the entire surface of the substrate 10 and then selectively patterned by using another photolithography process (a third masking process) to form a source electrode 22 and a drain electrode 23 at an upper portion of the active pattern 24. At this time, a certain portion of the n+ amorphous silicon thin film pattern formed on the active pattern 24 is removed through the third masking process to form an ohmic contact layer 25' between the active pattern 24 and the source and drain electrodes 22 and 23.

Subsequently, as shown in FIG. 2D, a second insulation film 15B is deposited on the entire surface of the substrate 10 with the source electrode 22 and the drain electrode 23 formed thereon, and a portion of the second insulation film 15B is removed through another photolithography process (a fourth masking process) to form a contact hole 40 exposing a portion of the drain electrode 23.

Finally, as shown in FIG. 2E, a transparent conductive metal material is deposited on the entire surface of the substrate 10 and then selectively patterned by using another photolithography process (a fifth making process) to form a pixel electrode 18 electrically connected to the drain electrode 23 via the contact hole 40.

As mentioned above, it requires five (5) photolithography processes to fabricate the array substrate including the TFTs to pattern the gate electrode, the active pattern, the source and drain electrodes, the contact hole and the pixel electrode.

The photolithography process is a process of transferring a pattern formed on a mask onto the substrate on which a thin film is deposited to form a desired pattern, each of which includes a plurality of processes such as a process of coating a photosensitive solution, an exposing process and a developing process, etc. As a result, multiple photolithography processes may degrade the production yield and increase the probability of generating a defective TFT.

In particular, because the masks designed for forming the pattern is quite expensive, as the number of masks applied for the processes increases, the fabrication cost of the LCD increases proportionally.

BRIEF DESCRIPTION OF THE INVENTION

Therefore, an object of the present invention is to fabricate a liquid crystal display (LCD) with less masks used when fabricating thin film transistors (TFTs).

To achieve these and other advantages and in accordance with the purpose of the present invention, as embodied and broadly described herein, there is provided a LCD including: a first substrate having a pixel portion and a pad portion; a gate line and a data line crossing each other to define the pixel portion; a transistor adjacent to a crossing of the gate line and the data line, the transistor including a gate electrode, a source electrode and a drain electrode; an insulating layer above the source electrode and the drain electrode, the insulating layer exposing a lateral side of the drain electrode; a pixel electrode in contact with the lateral side of the drain electrode; a second substrate attached to the first substrate; and a liquid crystal layer between the first substrate and a second substrate.

To achieve the above object, there is also provided a method for fabricating an LCD including: providing a first substrate having a pixel portion and a pad portion and providing a second substrate; forming a gate line and a gate electrode of a transistor at the pixel portion of the first substrate and patterning a first thin film above the gate line, using a single first mask; patterning the patterned first thin film to form an active layer of the transistor and forming a source electrode of the transistor, a drain electrode of the transistor, and a data line, wherein the gate line and the data line cross each other to define the pixel portion; forming a pixel electrode electrically connected to the drain electrode at the pixel portion; and forming a liquid crystal layer between the first and second substrates.

In another aspect of the present invention, a method for fabricating an LCD includes providing a first substrate having a pixel portion and a pad portion and providing a second substrate; forming a gate line and a gate electrode of a transistor at the pixel portion of the first substrate and patterning a first thin film above the gate line; patterning the patterned first thin film to form an active layer of the transistor and forming a source electrode of the transistor, a drain electrode of the transistor, and a data line, wherein the gate line and the data line cross each other to define the pixel portion, using a single first mask; forming a pixel electrode electrically connected to the drain electrode at the pixel portion, using a single second mask; and forming a liquid crystal layer between the first and second substrates.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

A liquid crystal display (LCD) and its fabrication method according to exemplary embodiments of the present invention will be described with reference to the accompanying drawings.

Figure 1:
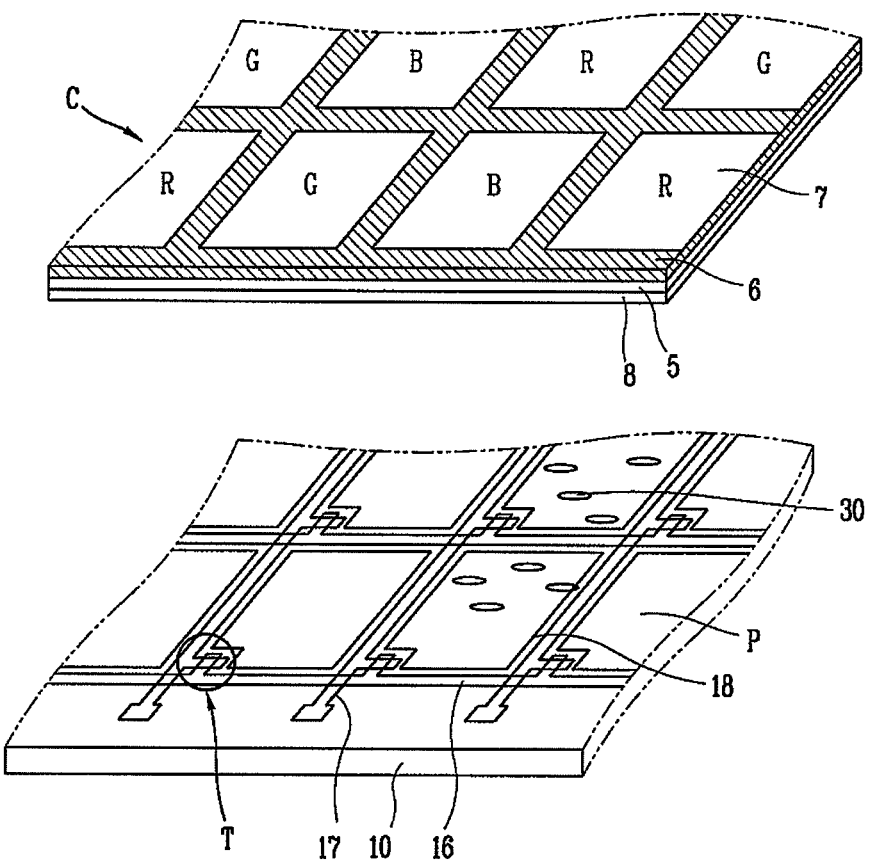
FIG. 1 is an exploded perspective view showing a general liquid crystal display (LCD)
Figure 2A:
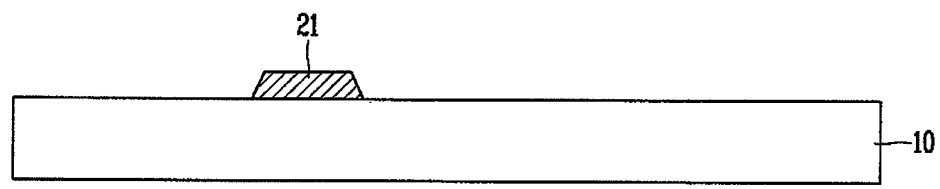
FIGS. 2A to 2E are sectional views sequentially showing a fabrication process of the array substrate of the LCD in FIG. 1.
Figure 2B:
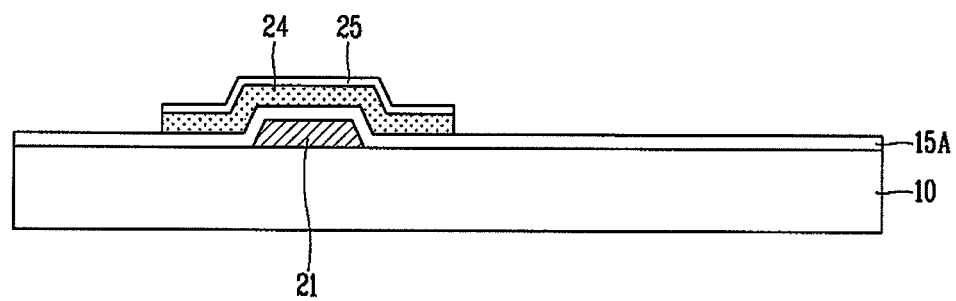
Figure 2C:
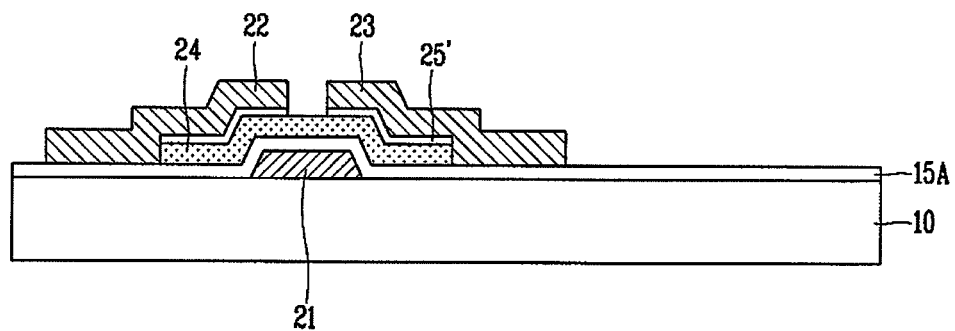
Figure 2D:
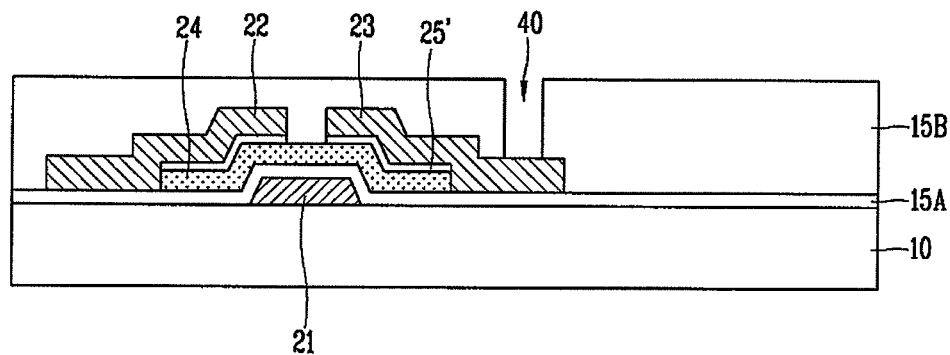
Figure 2E:
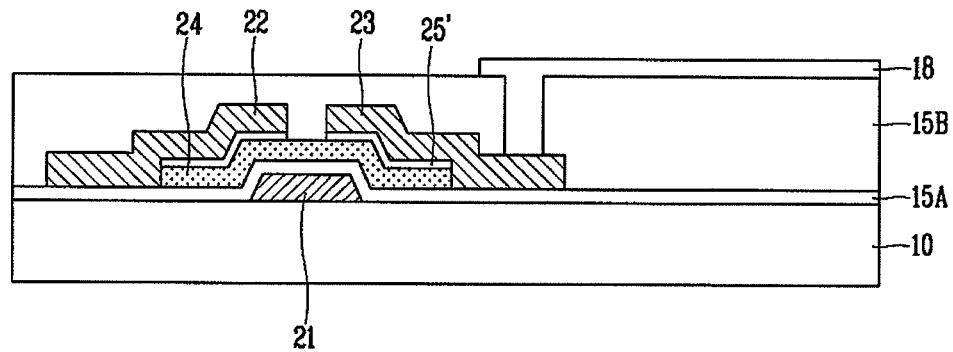
Figure 3:
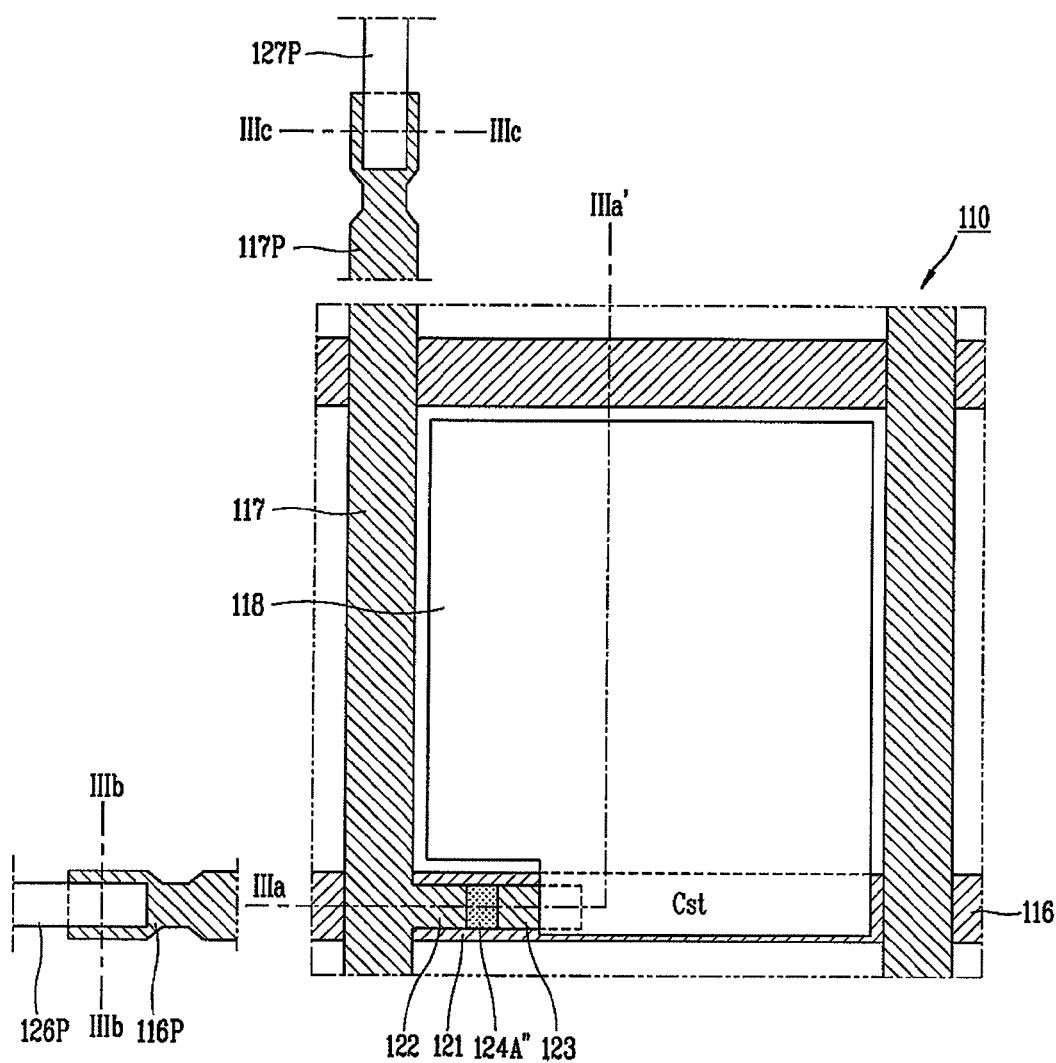
FIG. 3 is a plan view showing a portion of an array substrate of an LCD according to an embodiment of the present invention.

FIG. 3 is a plan view showing a portion of an array substrate of an LCD according to an embodiment of the present invention, in which a single pixel including a gate pad portion and a data pad portion are shown.

The N number of gate lines and M number of data lines are formed to cross each other to define the M×N number of pixels on an array substrate, and only one pixel is shown on the drawing merely for the sake of brevity.

As shown, the gate line 116 and the data line 117 cross each other to define a pixel portion on an array substrate 110. A thin film transistor (TFT) as a switching element is formed at a crossing of the gate line 116 and the data line 117. A pixel electrode 118 for being connected with the TFT to drive liquid crystal (not shown) together with a common electrode on a color filter substrate (not shown) is formed in the pixel portion.

A gate pad electrode 126P and a data pad electrode 127P are formed at an edge portion of the array substrate 110, electrically connected with the gate line 116 and the data line 117, respectively, and transfer a scan signal and a data signal applied from an external driving circuit unit (not shown) to the gate line 116 and the data line 117.

That is, the gate line 116 and the data line 117 extend toward the driving circuit unit to form a gate pad line 116P and a data pad line 117P, and the gate pad line 116P and the data pad line 117P receive the scan signal and the data signal from the driving circuit unit through the gate pad electrode 126P and the data pad electrode 127P electrically connected with the lines 116P and 117P, respectively.

The TFT includes a gate electrode 121 formed as a part of the gate line 116, a source electrode 122 connected with the data line 117, and a drain electrode 123 connected with the pixel electrode 118. In addition, the TFT includes a first insulation film (not shown) for insulating the gate electrode 121 and the source/drain electrodes 122 and 123 and an active pattern 124A" for forming a conductive channel between the source and drain electrodes 123 by a gate voltage supplied to the gate electrode 121.

In this manner, in the illustrated embodiment, the gate electrode 121 is formed of a portion of the gate line 116 on which the active pattern 124A" are positioned, and the active pattern 124A" and the source/drain electrodes 122 and 123 are positioned at the upper portion of the gate electrode 121.

In this embodiment, a portion of the source electrode 122 is connected with the data line 117, forming a portion of the data line 117, and a portion of the drain electrode 123 extends toward the pixel electrode 118 so as to be electrically connected directly with a portion of the pixel electrode 118.

A portion of the gate line 116 overlaps with a portion of the pixel electrode 118 with the first insulation film interposed therebetween, forming a storage capacitor (Cst). The storage capacitor (Cst) uniformly sustains a voltage applied to a liquid crystal capacitor. Namely, the pixel electrode 118 of the array substrate 110 forms the liquid crystal capacitor together with the common electrode of the color filter substrate. In general, the voltage applied to the liquid crystal capacitor is not sustained until a next signal is received, but is leaked. Thus, to sustain the applied voltage, the storage capacitor (Cst) must be connected with the liquid crystal capacitor.

Besides the sustaining of the signal, the storage capacitor (Cst) has an effect of stabilizing a gray level and minimizing the residual image.

In the array substrate 110, the gate electrode 121 is formed and at the same time a line width of the active pattern 124A" is determined through a first masking process, the source and drain electrodes 122 and 123 and the active pattern 124A" are formed through a second masking process, and the pixel electrode 118 and the pad portion electrodes 126P and 127P are formed by selectively etching the transparent conductive film through a third masking process. Therefore, the array substrate 110 can be fabricated through three (3) masking processes, which will be described in detail through the fabrication process of the LCD.

Figure 4A:
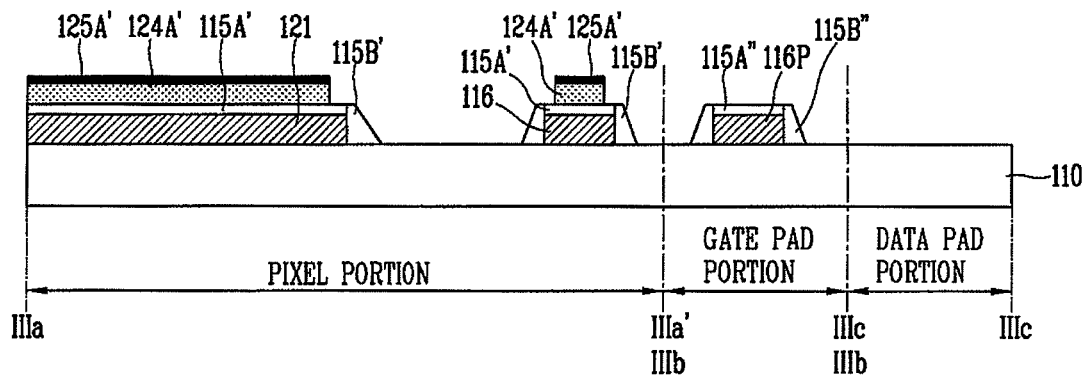
FIGS. 4A to 4C are sectional views sequentially showing a fabrication process taken along lines and IIia-IIIa', IIIb-IIIb' and IIIc-IIIc' of the array substrate in FIG. 3.
Figure 4B:
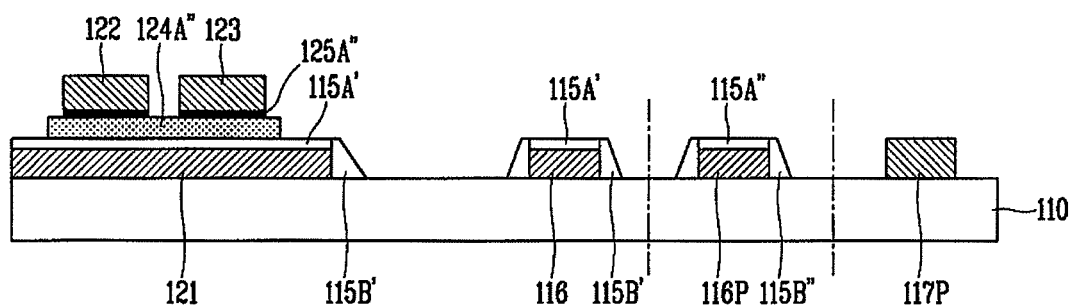
Figure 4C:
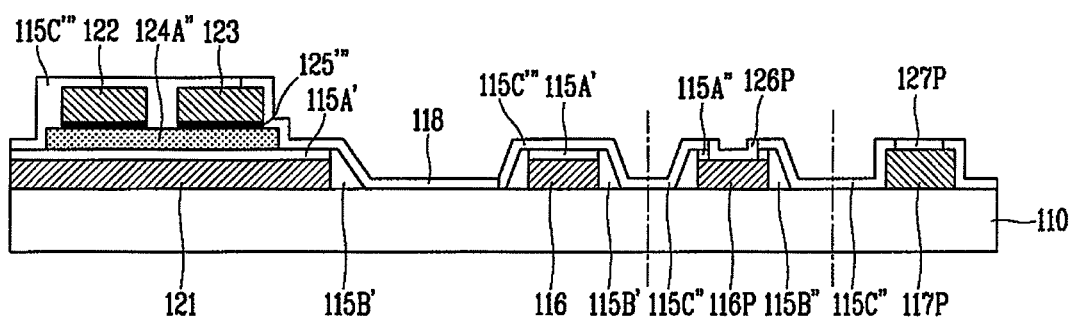

FIGS. 4A to 4C are sectional view sequentially showing a fabrication process of the array substrate in FIG. 3, in which the left side shows a process for fabricating the array substrate of the pixel portion and the right side shows a process of fabricating the array substrate of the gate pad portion and the data pad portion sequentially.

As shown in FIG. 4, the gate electrode 121 and the gate line 116 are formed at the pixel portion of the substrate 110 made of a transparent insulation material such as glass, and a gate pad line 116P is formed at the gate pad portion. In this embodiment, as mentioned above, the gate electrode 121 is formed of a portion of the gate line 116, and only for the sake of explanation, the gate electrode 121 is denoted by a different reference numeral from the gate line 116.

A gate insulation film 115A', an amorphous silicon thin film pattern 124A' and an n+ amorphous silicon thin film pattern 125A' are formed at the upper portion of the gate electrode 121 and the gate line 116. The amorphous silicon thin film pattern 124A' and the n+ amorphous silicon thin film pattern 125A' have a line width narrower than that of the gate electrode 121, and formed by using the same mask in the process of forming the gate electrode 121 and the gate line 116. The amorphous silicon thin film pattern 124A' formed with a certain width is patterned with an active pattern through a follow-up process.

In this manner, in the illustrated embodiment, the gate electrode 121 and the gate line 116 are simultaneously formed through a single masking process (the first masking process) by using a diffraction exposure (slit exposure) and at the same time the line width of the active pattern is determined. The first masking process will be described in detail with reference to the accompanying drawings.

Figure 5A:
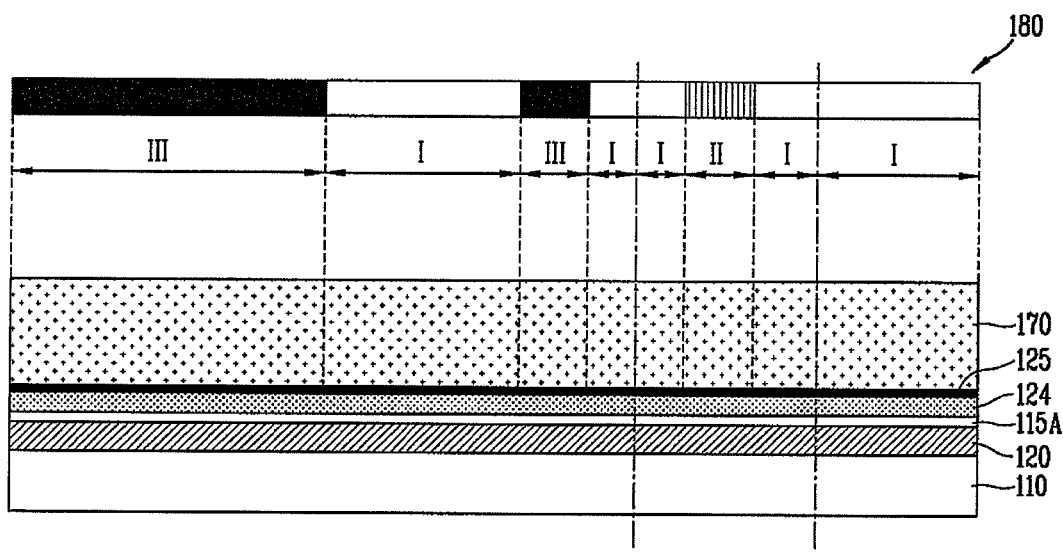
FIGS. 5A to 5E are sectional views showing a first masking process in FIG. 4A.
Figure 5B:
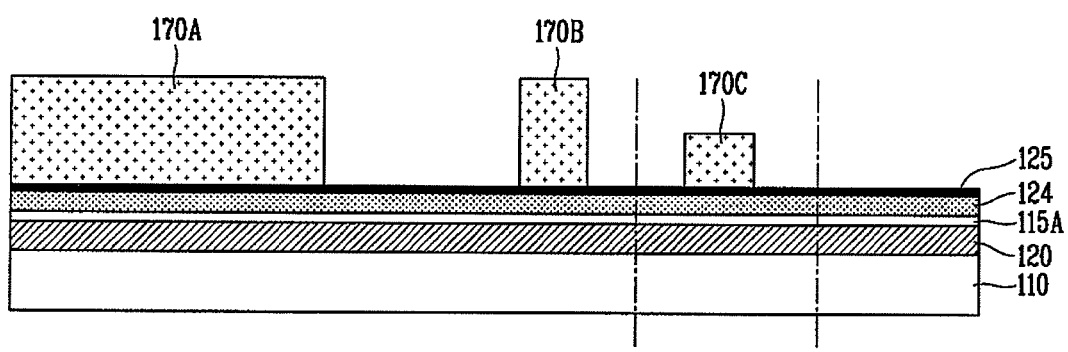
Figure 5C:
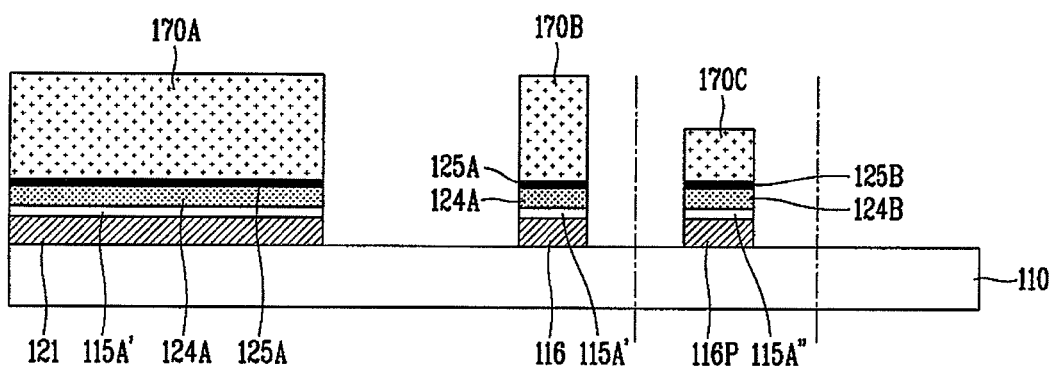
Figure 5D:
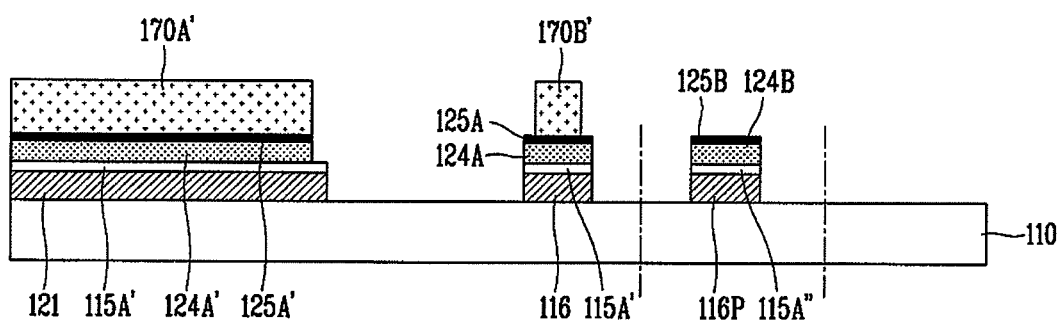
Figure 5E:
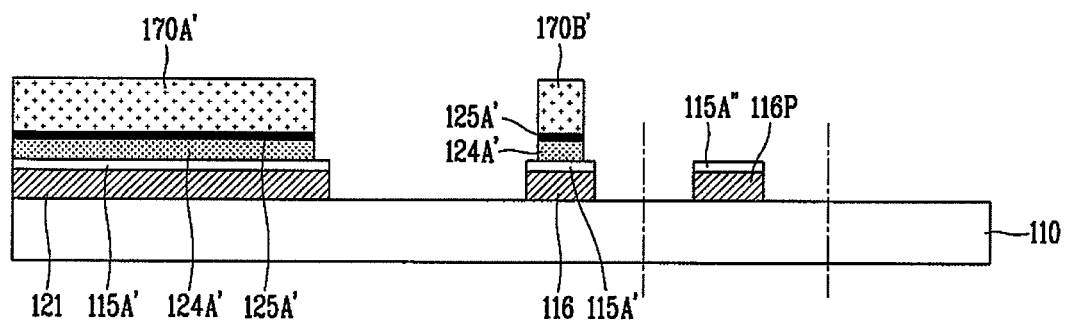
Figure 6A:
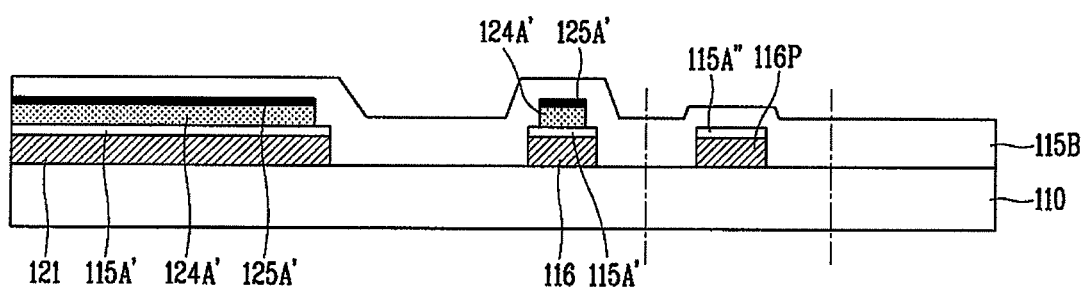
FIGS. 6A and 6B are sectional views showing a method for forming a side wall according to an embodiment of the present invention.
Figure 6B:
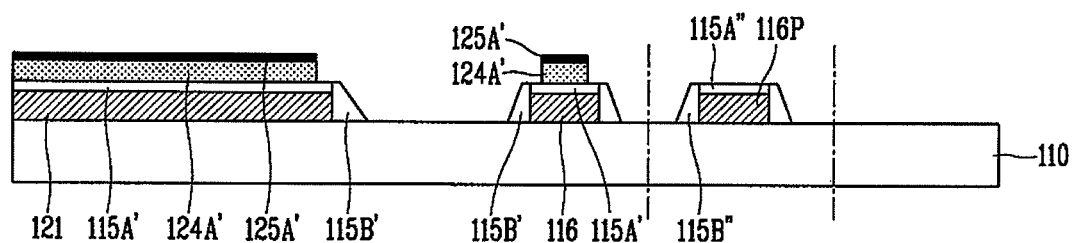

FIGS. 5A to 5E are sectional view showing the first masking process in FIG. 4A, and FIGS. 6A and 6B are sectional views showing a method for forming a side wall according to an embodiment of the present invention.

As shown in FIG. 5A, a first conductive film 120, a first insulation film 115A, an amorphous silicon thin film 124 and an n+ amorphous silicon thin film 125 are deposited on the entire surface of the substrate 110.

Herein, as the first conductive film 120, a low resistance opaque conductive material such as aluminum (Al), an Al alloy, tungsten (W), copper (Cu), chromium (Cr) and molybdenum (Mo), etc. can be used.

Thereafter, a photosensitive film 170 made of a photosensitive material such as photoresist is formed on the entire surface of the substrate 110, on which light is selectively irradiated through a slit mask 180.

In this embodiment, the slit mask 180 includes a transmission region (I) for entirely transmitting irradiated light, a slit region (II) with a slit pattern for partially transmitting light and blocking a portion of light, and a blocking region (III) for entirely blocking irradiated light. Only light which has transmitted through the slit mask 180 can be irradiated on the photosensitive film 170.

Subsequently, when the photosensitive film 170 which has been exposed through the slit mask 180 is developed, as shown in FIG. 5B, photosensitive film patterns 170A~470C with a certain thickness remain at regions where light has been entirely blocked or partially blocked through the blocking region (III) and the slit region (II), and the photosensitive film at the transmission region (I) to which light has been entirely transmitted is completely removed to expose the surface of the n+ amorphous silicon thin film 125.

In this embodiment, the first and second photosensitive film patterns 170A and 170B formed at the blocking region (III) are thicker than the third photosensitive film pattern 170C formed at the slit region (II). In addition, the photosensitive film at the region to which light has been entirely transmitted through the transmission region (I) is completely removed, which is because positive photoresist is used. In this respect, however, the present invention is not limited thereto and negative photoresist can be also used.

Next, as shown in FIG. 5C, the first conductive film, the first insulation film, the amorphous silicon thin film and the n+ amorphous silicon thin film are selectively removed by using the photosensitive film patterns 170A~170C as masks to form the gate electrode 121 and the gate line 116 formed of the first conductive film at the pixel portion of the substrate 110 and the gate pad line 116P formed of the first conductive film at the gate pad portion.

In this embodiment, at the upper portion of the gate electrode 121 and the gate line 116, the gate insulation film 115A', the first amorphous silicon thin film pattern 124A and the first n+ amorphous silicon thin film pattern 125A formed of the first insulation film remain. The amorphous silicon thin film and the n+ amorphous silicon thin film are patterned in the same form as the gate electrode 121 and the gate line 116. In addition, at the upper portion of the gate pad line 116P, the gate pad insulation film 115A", the second amorphous silicon thin film pattern 124B and the second n+ amorphous silicon thin film pattern 125B formed of the first insulation film remain. The amorphous silicon thin film and the n+ amorphous silicon thin film are patterned in the same form as the gate pad line 116P.

Thereafter, when an ashing process is performed to remove a portion of the photosensitive film patterns 170A~170C, as shown in FIG. 5D, the third photosensitive film pattern of the upper portion of the gate pad line 116P, namely, of the slit region (II) to which the slit exposure has been applied, is completely removed to expose the surface of the second n+ amorphous silicon thin film pattern 125B.

In this embodiment, the first and second photosensitive film patterns 170A and 170B respectively remain as fourth photosensitive film pattern 170A' and fifth photosensitive film pattern 170B' with a thickness obtained by partially removing the third photosensitive film pattern at the upper portion of the gate electrode 121 and the gate line 116 corresponding to the blocking region (III). In this embodiment, as shown in FIG. 5D, the fourth and fifth photosensitive film patterns 170A' and 170B' can have such a form that their sides are partially removed through the ashing process.

Thereafter, as shown in FIG. 5E, a portion of the first amorphous silicon thin film pattern and the first n+ amorphous silicon thin film pattern at the upper portion of the gate electrode 121 and the gate line 116 is removed by using the remaining fourth and fifth photosensitive film patterns 170A' and 170B' as masks. Namely, a portion of the side of the first amorphous silicon thin film pattern and the firth n+ amorphous silicon thin film pattern of the pixel portion is removed to remain as a third amorphous silicon thin film pattern 124A' and a third n+ amorphous silicon thin film pattern 125A' at the upper portion of the gate electrode 121 and the gate line 116.

In this embodiment, the second amorphous silicon thin film pattern 124B and the second n+ amorphous silicon thin film pattern 125B of the gate pad portion are completely removed to expose the surface of the gate pad insulation film 115A".

As shown in FIGS. 6A and 6B, a certain organic film 115B is coated on the entire surface of the substrate 110 with the gate electrode 121, the gate line 116 and the gate pad line 116P formed thereon and then partially removed through the ashing process to form first and second side walls 115B' and 115B" for protecting the side of the gate electrode 121, the gate line 116 and the gate pad line 116P. Namely, the first and second side walls 115B' and 115B" protect the side of the gate lines (the gate electrode 121, the gate line 116 and the gate pad line 116P), preventing the side of the gate lines from being exposed, so that when data lines (source and drain electrodes, a data line and a data pad line) (to be described) are formed, the gate electrode lines 121, 116 and 116P and the data lines cannot become short circuited.

Next, as shown in FIG. 4B, through a single masking process (a second masking process), the source and drain electrodes 122 and 123 are formed at the upper portion of the gate electrode 121, and the active pattern 124A" as a conductive channel between the source and drain electrodes 122 and 123 is formed by patterning the third amorphous silicon thin film pattern.

The third n+ amorphous silicon thin film pattern is patterned through the second masking process to form an ohmic-contact layer 125A''' for ohmic-contacting the source and drain electrodes 122 and 123 and the active pattern 124A". In addition, the data pad line 117P made of a conductive material for the source and drain electrodes 122 and 123 is formed at the data pad portion of the substrate 110.

In this manner, in the illustrated embodiment, the source and drain electrodes 122 and 123 and the data pad line 117p are formed and at the same time as the active pattern 124A" is formed through the second masking process using the slit exposure. The second masking process will be described in detail as follows.

FIGS. 7A to 7F are sectional views showing the second masking process in FIG. 4B.

Figure 7A:
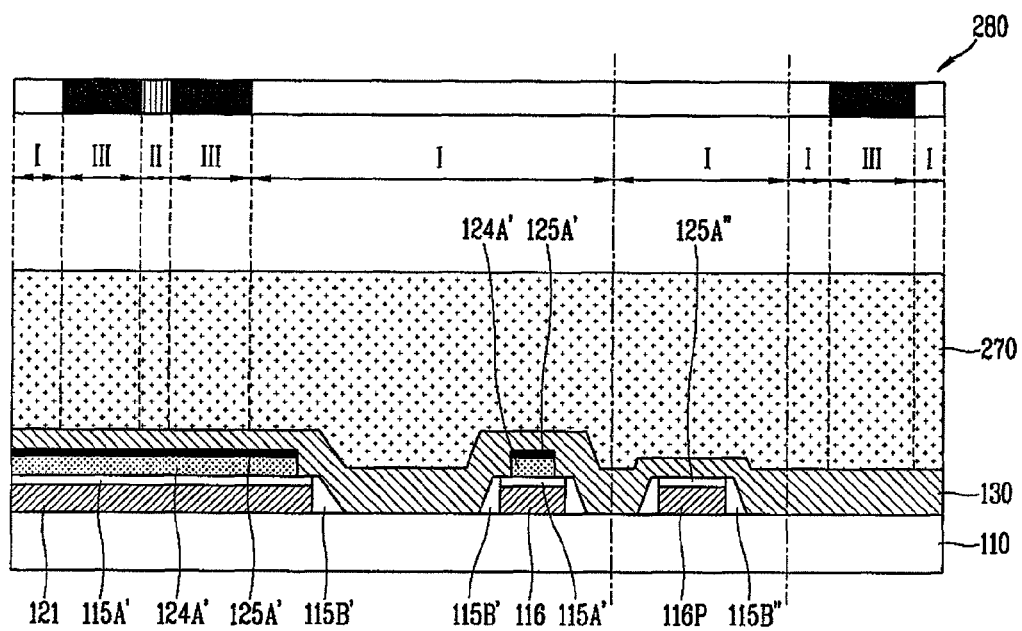
FIGS. 7A to 7F are sectional views showing a second masking process in FIG. 4B.

As shown in FIG. 7A, a second conductive film 130 and a photosensitive film 270 are formed on the entire surface of the substrate 110, and light is selectively irradiated onto the photosensitive film 270 through a slit mask 280.

In this embodiment, the slit mask 280 includes a transmission region (I) for entirely transmitting irradiated light, a slit region (II) with a slit pattern for partially transmitting light and blocking a portion of light, and a blocking region (III) for entirely blocking irradiated light. Only light which has transmitted through the slit mask 280 can be irradiated on the photosensitive film 270.

Figure 7B:
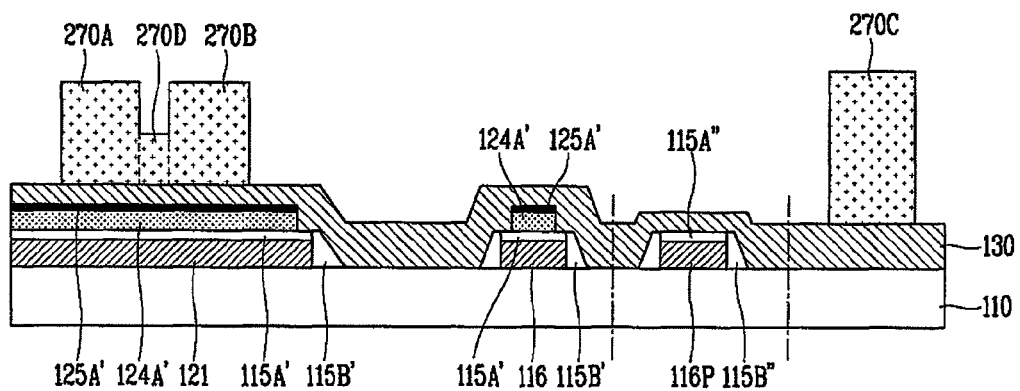

Subsequently, when the photosensitive film 270 which has been exposed through the slit mask is developed, as shown in FIG. 7B, photosensitive film patterns 270A~270D with a certain thickness remain at regions where light has been entirely blocked or partially blocked through the blocking region (III) and the slit region (II), and the photosensitive film at the transmission region (I) to which light has been entirely transmitted is completely removed to expose the surface of the second conductive film 130.

In this embodiment, the first, second and third photosensitive film patterns 270A, 270B and 270C formed at the blocking region (III) are thicker than the fourth photosensitive film pattern 270D formed through the slit region (II). In addition, the photosensitive film at the region to which light has been entirely transmitted through the transmission region (I) is completely removed, which is because positive photoresist is used. In this respect, however, the present invention is not limited thereto and negative photoresist can be also used.

Figure 7C:
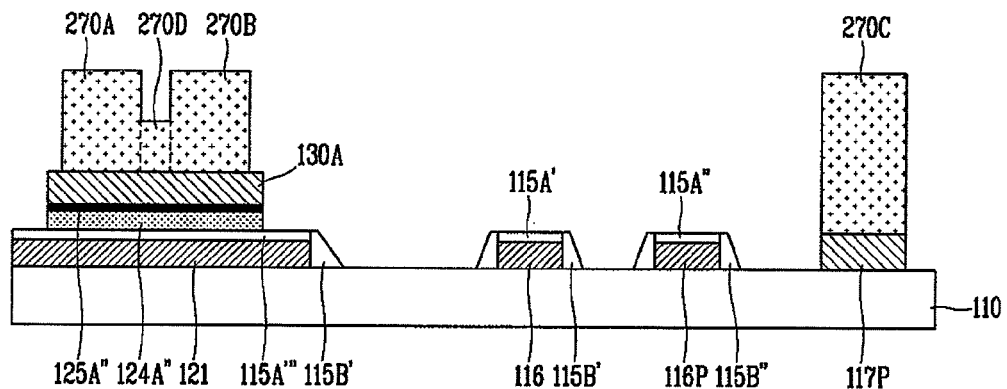

Next, as shown in FIG. 7C, the second conductive film, the third amorphous silicon thin film pattern and the third n+ amorphous silicon thin film pattern are selectively removed by using the photosensitive film patterns 270A~270D as masks to simultaneously form a pixel portion second conductive film pattern 130A formed of a second conductive film at an upper portion of the gate electrode 121 and at the same time a pad portion second conductive film pattern 130B made of the second conductive film.

In this embodiment, at the lower portion of the second conductive film pattern 130A of the pixel portion, the active pattern 124A" and the fourth n+ amorphous silicon thin film pattern made of the third amorphous silicon thin film pattern remain, and the third n+ amorphous silicon thin film pattern are patterned in the same form as the second conductive pattern 130A of the pixel portion.

Figure 7D:
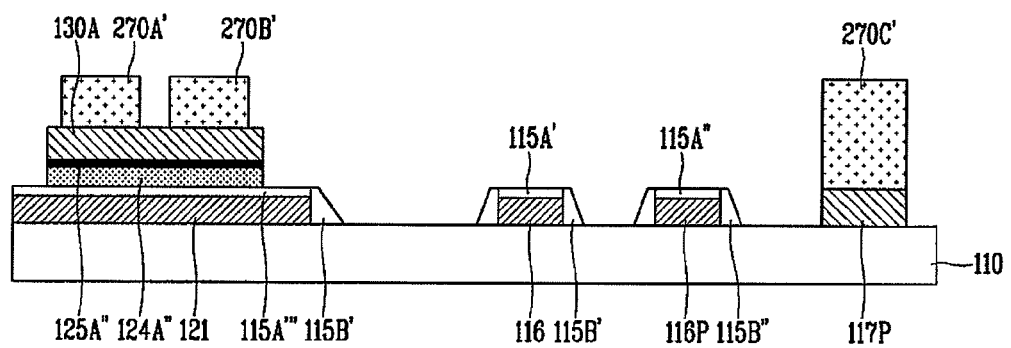

Thereafter, when the ashing process is performed to remove a portion of the photosensitive film patterns 270A~270D, as shown in FIG. 7D, the fourth photosensitive film pattern of the upper portion of a certain region of the active pattern 124A", namely, of the slit region (II) to which the slit exposure has been applied, is completely removed to expose the surface of the second conductive film pattern 130A of the pixel portion.

In this embodiment, the first to third photosensitive film patterns 270A to 270C respectively remain as fifth to seventh photosensitive film patterns 270A' to 270C' with a thickness obtained by partially removing the fourth photosensitive film pattern at the upper portion of the certain region (source and drain regions) of the active pattern 124A" and the second conductive film pattern 130B corresponding to the blocking region (III). In this embodiment, as shown in FIG. 7D, the fifth to seventh photosensitive film patterns 270A' to 270C' can have such a form that their sides are partially removed through the ashing process.

Figure 7E:
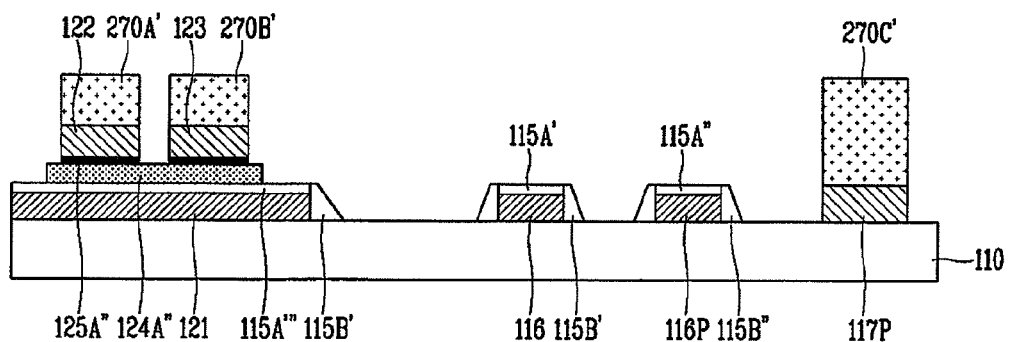
Figure 7F:
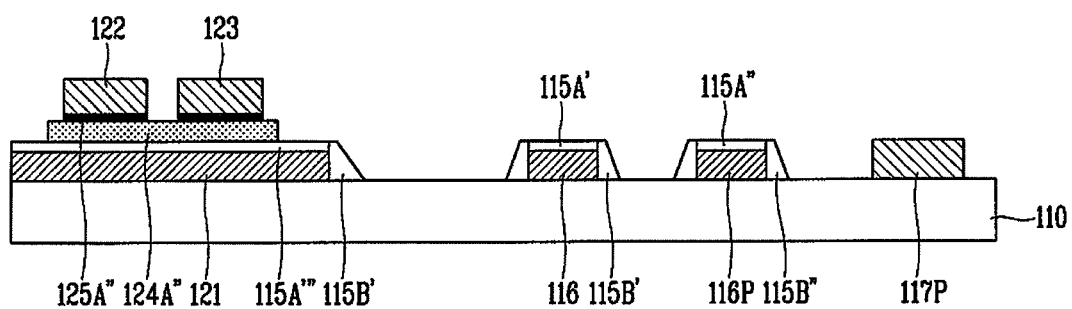

Thereafter, as shown in FIG. 7E, a portion of the fourth n+ amorphous silicon thin film pattern and the second conductive film pattern at the upper portion of the active pattern 124A" is etched and at the same time a portion of the second conductive film pattern of the data pad portion is etched by using the remaining fifth to seventh photosensitive film patterns 270A' to 270C' as masks. Namely, the second conductive film pattern of the pixel portion is patterned according to the form of the fifth and sixth photosensitive film patterns 270A' and 270B' to form the source and drain electrodes 122 and 123, and the second conductive film pattern of the pad portion is patterned according to the form of the second photosensitive film pattern 270C' to form the data pad line 117P. After the remaining photosensitive film pattern 270A', 270B' and 270C' are removed, the source and drain electrodes 122 and 123 and the data pad line 117P are formed as shown in FIG. 7F.

In this embodiment, the fourth n+ amorphous silicon thin film pattern of the pixel portion is patterned according to the form of the source and drain electrodes 122 and 123 to form the ohmic-contact layer 125A''' to make the source an drain electrodes 122 and 123 and the source and drain regions of the active pattern 124A'' ohmic-contacted.

As shown in FIG. 4C, the drain electrode 123 and the pixel electrode 118 which are electrically connected are formed through a single masking process (a third masking process), and at the same time, the gate pad electrode 126P and the data pad electrode 127P which are electrically connected with the gate pad line 116P and the data pad line 117P and exposed.

Herein, in the third masking process, when the second insulation film is patterned, the photosensitive film remains to be thin at the pixel portion, where the pixel electrode 118 is to be formed, by using the slit exposure using a half-tone or a slit. Thereafter, a pad portion opening is performed to expose a portion of the gate pad line 116P and the data pad line 117P, and the photosensitive film of the pixel portion is removed through the ashing process to remove the second insulation film of the pixel portion.

The pixel electrode 118 is formed at the pixel portion with a transparent conductive material, and the gate pad electrode 126P and the data pad electrode 127P which are electrically connected with the gate pad line 116P and the data pad line 117P are formed at the pad portion. In this embodiment, the pixel electrode 118, the gate pad electrode 126P and the data pad electrode 127P can be formed through surface processing of the photosensitive film and by using selective crystallization of the transparent conductive material such as indium tin oxide (ITO) without performing an additional masking process. The third masking process will be described in detail with reference to the accompanying drawings.

FIGS. 8A to 8I are sectional views showing a third masking process in FIG. 4C according to an embodiment of the present invention.

Figure 8A:
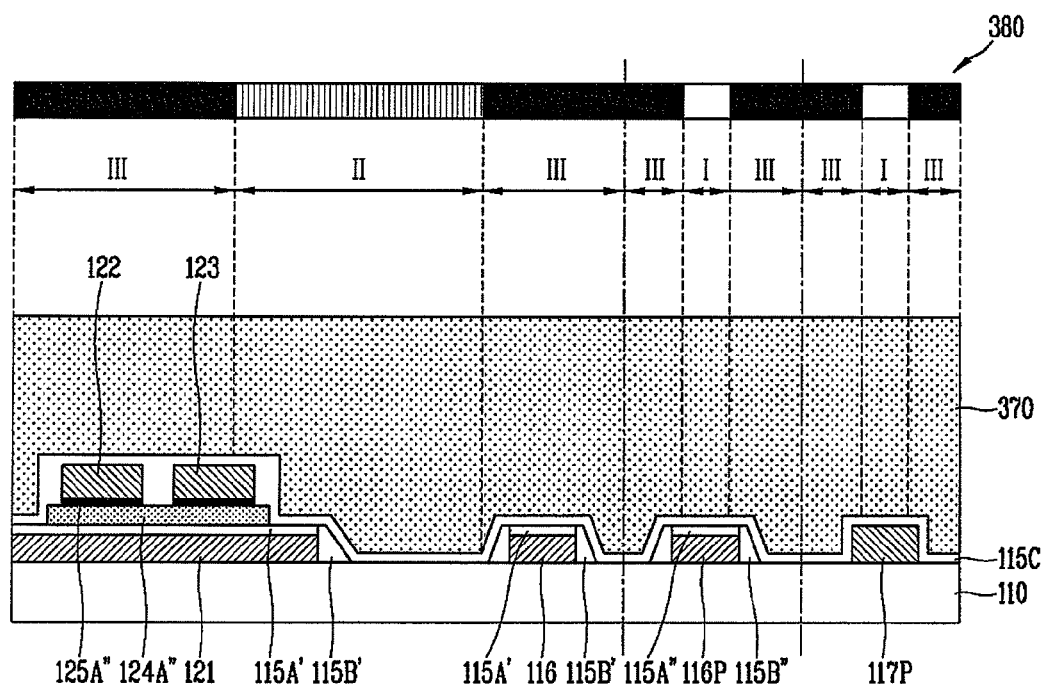
FIGS. 8A to 8I are sectional views showing a third masking process in FIG. 4C according to an embodiment of the present invention.

As shown in FIG. 8A, the second insulation film 115C and the first photosensitive film 370 made of a photosensitive material are formed on the entire surface of the substrate 110 on which the active pattern 124'', the source electrode 122 and the drain electrode 123, and light is selectively irradiated on the first photosensitive film 370 through the slit mask 380.

In this embodiment, the slit mask 380 includes a transmission region (I) for entirely transmitting irradiated light, a slit region (II) with a slit pattern for partially transmitting light and blocking a portion of light, and a blocking region (III) for entirely blocking irradiated light. Only light which has transmitted through the slit mask 380 can be irradiated on the photosensitive film 370.

Figure 8B:
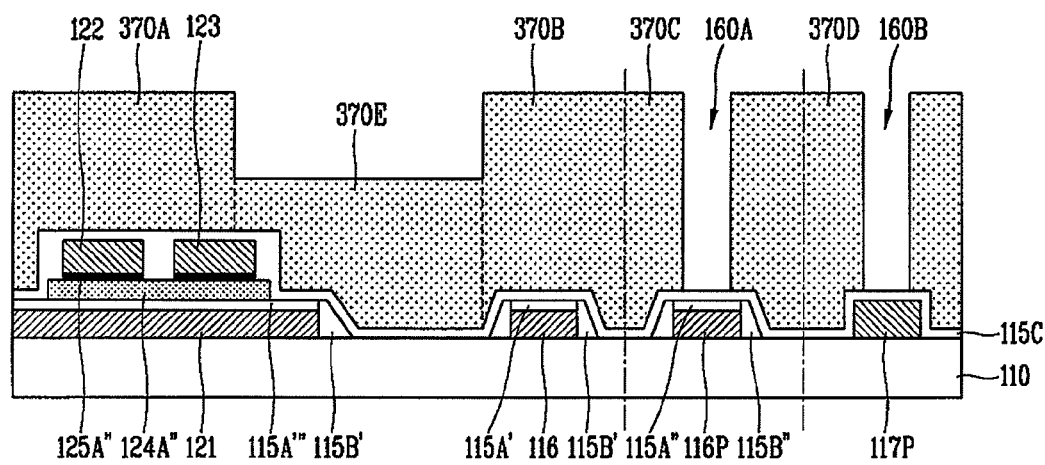

Subsequently, when the photosensitive film 370 which has been exposed through the slit mask is developed, as shown in FIG. 8B, photosensitive film patterns 370A~370D with a certain thickness remain at regions where light has been entirely blocked or partially blocked through the blocking region (III) and the slit region (II), and the photosensitive film at the transmission region (I) to which light has been entirely transmitted is completely removed to expose the surface of the second conductive film 130.

In this embodiment, the first to third photosensitive film patterns 370A to 370C formed at the blocking region (III) are thicker than the fourth photosensitive film pattern 370D formed through the slit region (II). In addition, the first photosensitive film at the region to which light has been entirely transmitted through the transmission region (I) is completely removed, which is because positive photoresist is used. In this respect, however, the present invention is not limited thereto and negative photoresist can be also used.

Figure 8C:
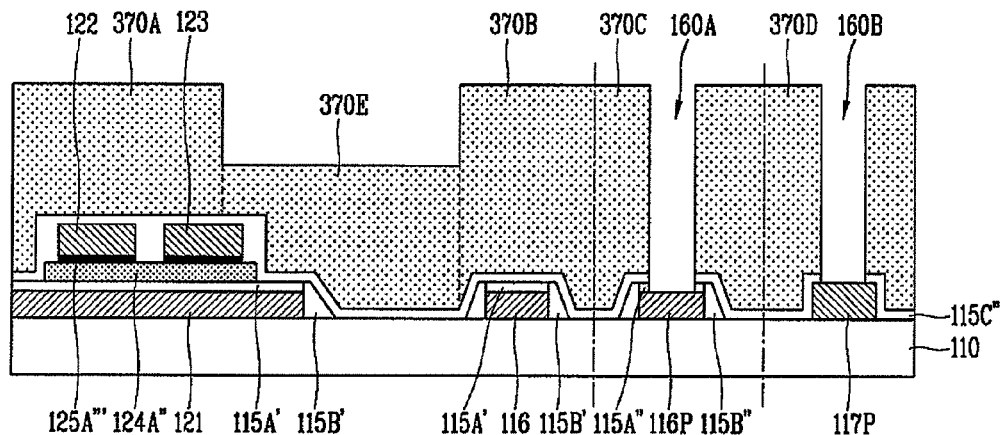

Next, as shown in FIG. 8C, the gate pad insulation film 115A'' and the second insulation film at the pad portion are selectively removed by using the photosensitive film patterns 370A~370D as masks to form first and second contact holes 160A and 160B exposing a portion of the gate pad line 116P and the data pad line 117P of the pad portion. In this embodiment, the second insulation film is patterned to form the pixel portion second insulation film 115C' at the pixel portion and the pad portion second insulation film pattern 115C''' at the pad portion.

Figure 8D:
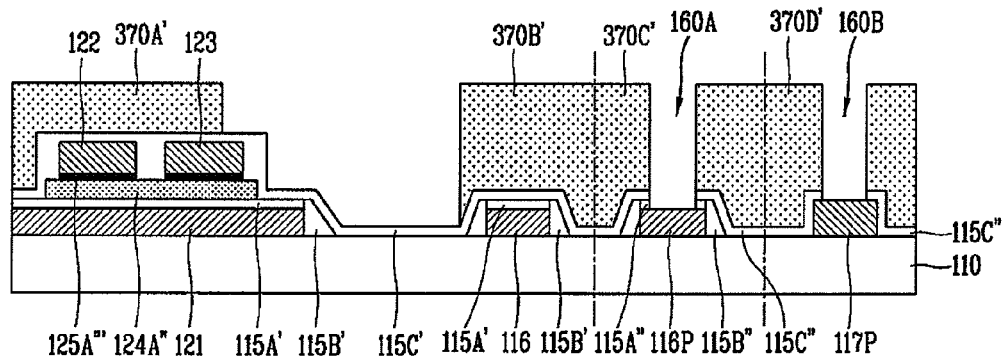

Thereafter, when the ashing process is performed to remove a portion of the photosensitive film patterns 370A~370D, as shown in FIG. 8D, the fourth photosensitive film pattern of a certain region, namely, of the slit region (II) to which the slit exposure has been applied, is completely removed to expose the surface of the second insulation film 115C' of the pixel portion.

In this embodiment, the first to third photosensitive film patterns 370A to 370C respectively remain as fifth to seventh photosensitive film patterns 370A' to 370C' with a thickness obtained by partially removing the fourth photosensitive film pattern 370D only at the portion corresponding to the blocking region (III).

Figure 8E:
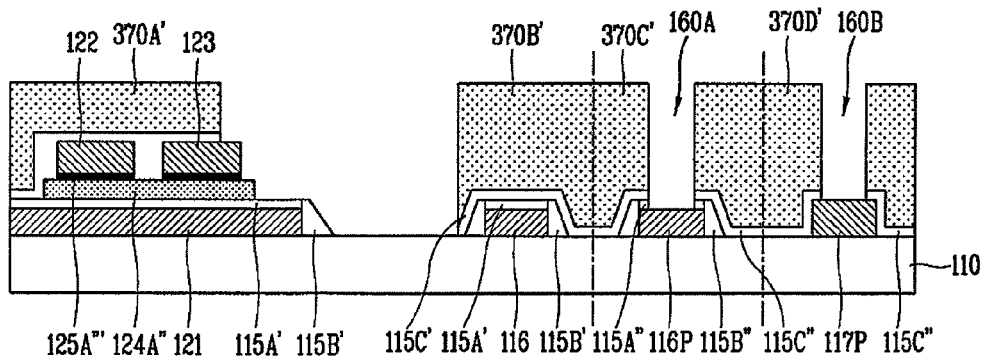

Thereafter, as shown in FIG. 8E, the pixel portion second insulation film 115C' of the pixel portion is partially removed by using the remaining fifth to seventh photosensitive film patterns 370A' to 370C' as masks. At this time, the pixel portion second insulation film pattern 115C' of the pixel portion is patterned to remove a portion of the pixel portion second insulation film of the pixel portion at one upper portion of the drain electrode 123 to expose a portion of the drain electrode 123.

Figure 8F:
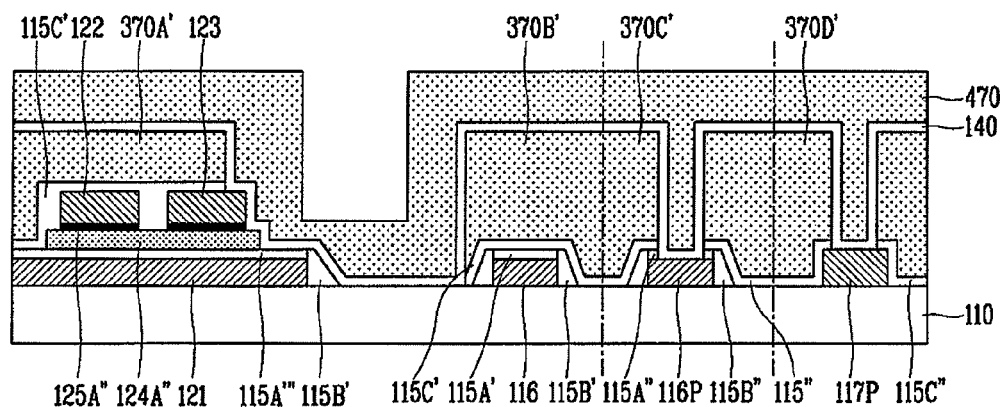

As shown in FIG. 8F, a third conductive film 140 is formed with a transparent conductive material on the entire surface of the substrate 110 on which the fifth and seventh photosensitive film patterns 370A' to 370C'.

In this embodiment, the third conductive film 140 includes a transparent conductive material with excellent transmittance such as indium tin oxide (ITO) or indium zinc oxide (IZO) to form the pixel electrode and the pad portion electrode. In this embodiment, before the third conductive film 140 is deposited, a plasma or heat treatment can be performed to proceed with a process for making the surface of the fifth to seventh photosensitive film patterns 370A' to 370C' hydrophobic. This is because the surface of the third conductive film 140 is hydrophilic. Therefore, the interface state with the fifth to seventh photosensitive film patterns 370A' to 370C' need to bad so as to selectively remove only the third conductive film 140 formed on the fifth to seventh photosensitive film patterns 370A' to 370C'.

Thereafter, a second photosensitive film 470 made of a photosensitive material is formed on the entire surface of the substrate 110 on which the third conductive film 140 is formed.

Figure 8G:
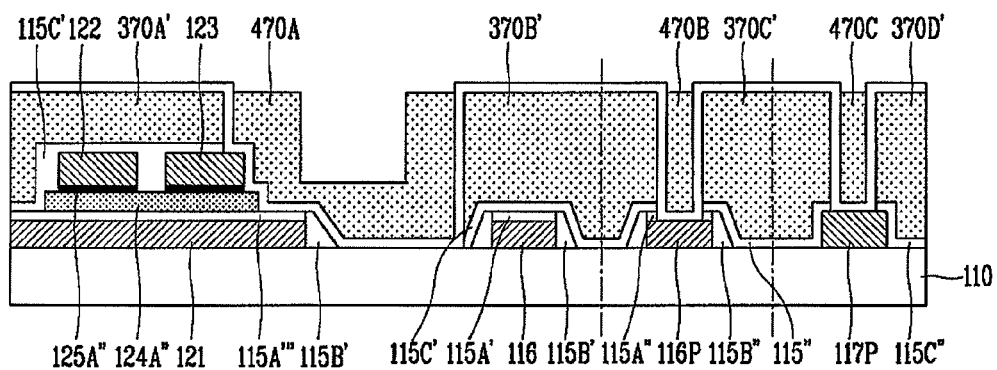

And as shown in FIG. 8G, the ashing process for removing a portion of the second photosensitive film 470 is performed to expose the third conductive film 140 at the regions other than the first and second contact hole regions. At this time, the eighth to tenth photosensitive film patterns 470A to 470C whose thickness has been partially removed through the ashing process can remain only at the upper portion of the first and second contact hole regions of the pixel portion and the pad portion.

Thereafter, when the third conductive film 140 is crystallized by performing a heat treatment at a temperature of about 100° C. to 200° C., only the third conductive film 140 at the regions other than regions where the fifth to seventh photosensitive film patterns 370A' to 370C' formed at the lower portion or the side of the third conductive film 140 can be selectively crystallized. This is because crystallization of the portion of the third conductive film 140 where the fifth to seventh photosensitive film patterns 370A' to 370C' are formed are interfered by an element such as carbon existing inside the fifth to seventh photosensitive film patterns 370A' to 370C' as organic films.

Figure 8H:
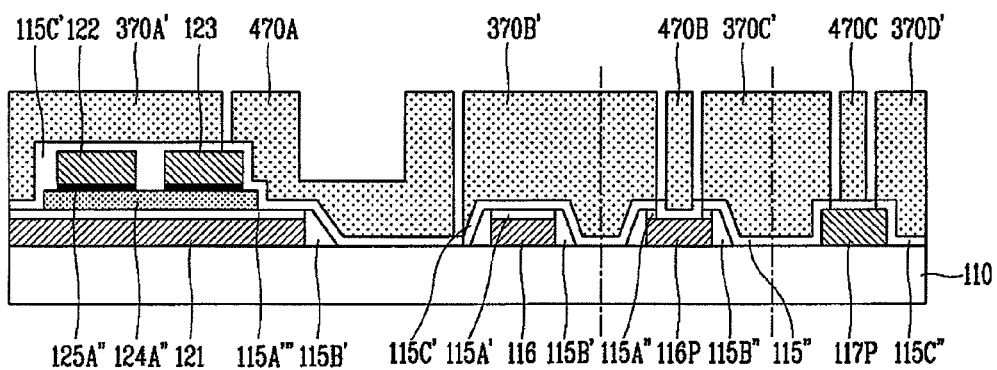
Figure 8I:
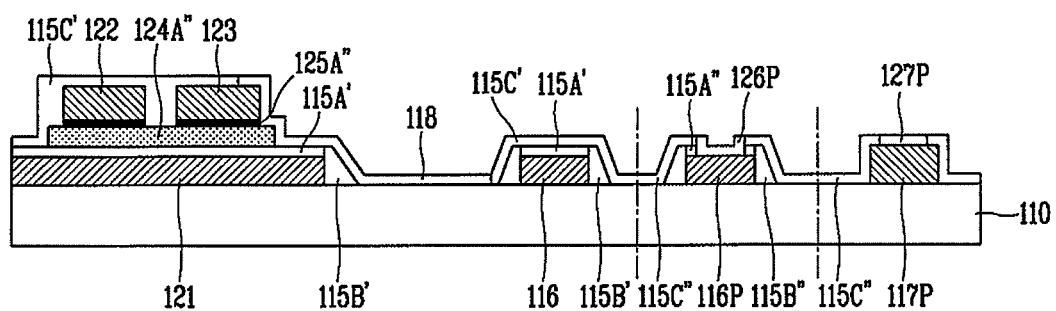

When only the third conductive film 140 in the exposed amorphous state is selectively removed, as shown in FIG. 8H, the pixel electrode 118 is formed at the pixel portion and at the same time as the gate pad electrode 126P and the data pad electrode 127P are formed at the first and second contact hole regions of the pad portion.

In this embodiment, the gate pad electrode 126P is electrically connected with the lower gate pad line 116P and the data pad electrode 127P is electrically connected with the lower data pad line 117P.

In addition, the pixel electrode 118 is electrically connected with a portion of the lower drain electrode 123, and the drain electrode 132 can be electrically connected directly with the upper pixel electrode 118 through a contact hole.

A portion of the pixel electrode 118 overlaps with a portion of the gate line 16 to form a storage capacitor (Cst) (refer to FIG. 3) together with the gate line 116 with the first insulation film 115A' of the pixel portion interposed therebetween.

Figure 9A:
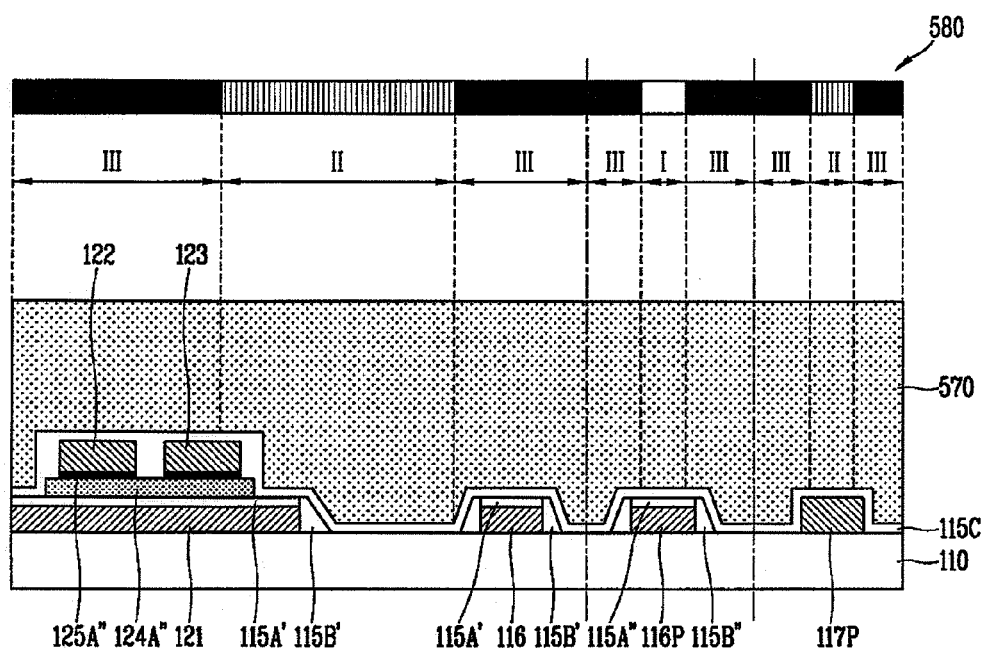
FIG. 9A to 9I are sectional views showing a third masking process in FIG. 4C according to another embodiment of the present invention.
Figure 9B:
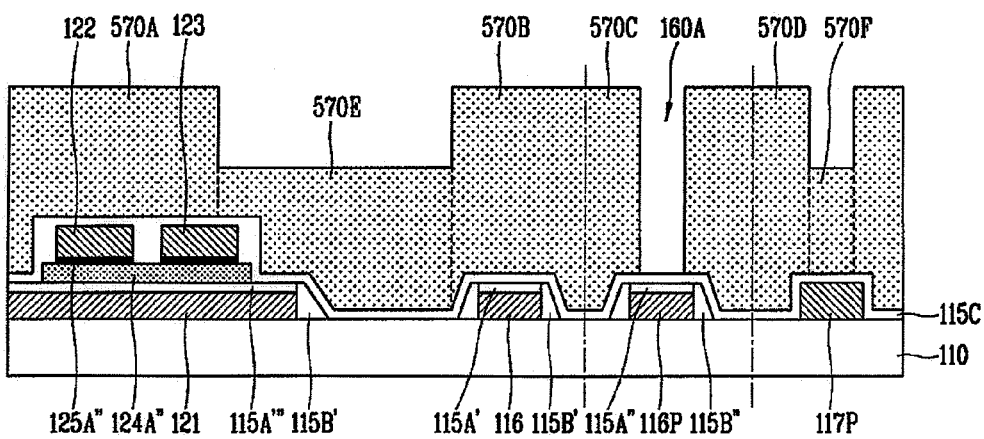
Figure 9C:
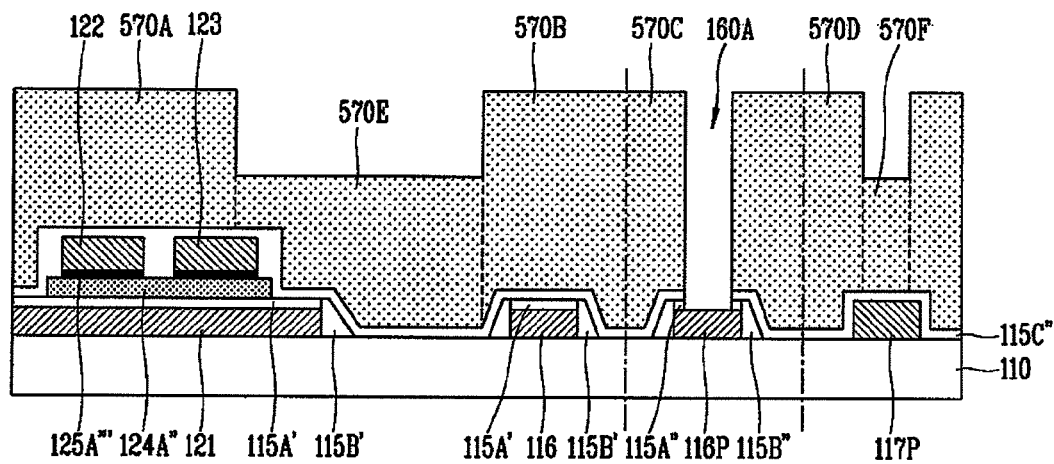

FIGS. 9A to 9I are sectional views showing a third masking process in FIG. 4C according to an embodiment of the present invention. The third masking process shown in FIGS. 9A to 9I is similar to the third masking process shown in FIGS. 8A to 8I. However, unlike the embodiment as shown in FIGS. 8A-8I, the slit mask 580 has a slit region (II) corresponding to the data pad line 117P for partially transmitting light such that when the photosensitive film 570 which has been exposed through the slit mask is developed, as shown in FIGS. 9A and 9B, a photosensitive film pattern 570F with a certain thickness remains. By doing so, the pad portion second insulation film pattern 115C" above the data pad line 117P is still protected by the photosensitive film pattern 570F when the pad portion second insulation film pattern 115C" above the gate pad line 116P as shown in FIG. 9C.

Figure 9D:
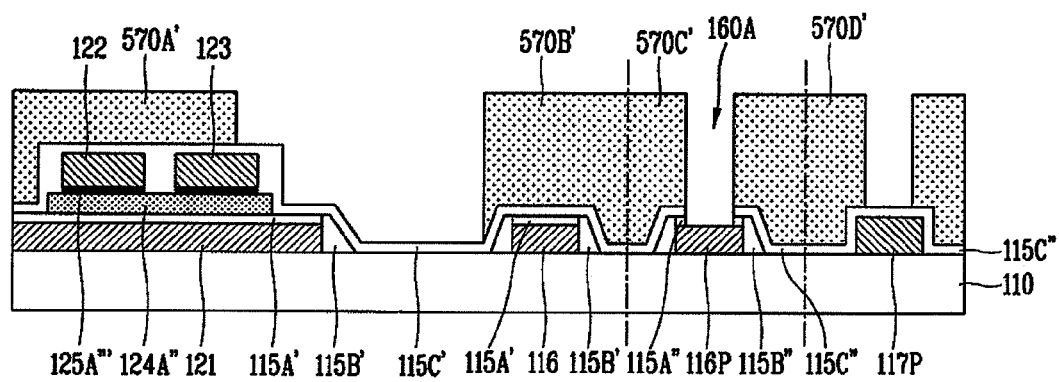
Figure 9E:
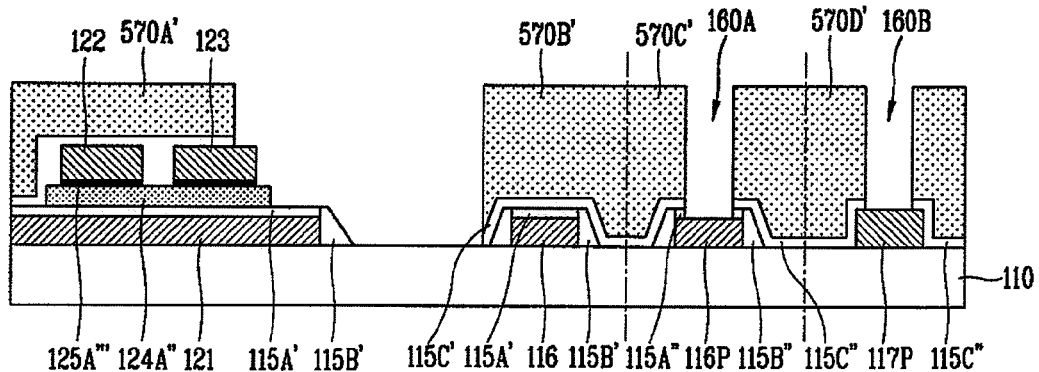

Subsequently, the photosensitive film pattern 570F is removed by an ashing process to expose the pad portion second insulation film pattern 115C" above the data pad line 117P as shown in FIG. 9D, and the data pad line 117P is exposed by removing the pad portion second insulation film pattern 115C" above the data pad line 117P in FIG. 9E. In other words, the pad portion second insulation film pattern 115C" above the data pad line 117P and the pixel portion second insulation film pattern 115C' will be removed at the same time as shown in FIG. 9E. Therefore, unlike the embodiment shown in FIGS. 8D and 8E, the data pad line 117P may be protected from being over-etched. In particular, as shown in FIGS. 8D and 8E, the pad portion second insulation film pattern 115C" above the data pad line 117P is etched before the pixel portion second insulation film pattern 115C' is removed. However, when removing the pixel portion second insulation film pattern 115C', the exposed data pad line 117P will be subject to the etching process. By forming the photosensitive film pattern 570F, the data pad line 117P may be protected from being over-etched.

To further protect the data pad line 117P from being over-etched, in an embodiment, Molybdenum (Mo) can be used as the second conductive film 130 such that the data pad line 117P (and the source electrode and the drain electrode) is made of Mo.

Figure 9F:
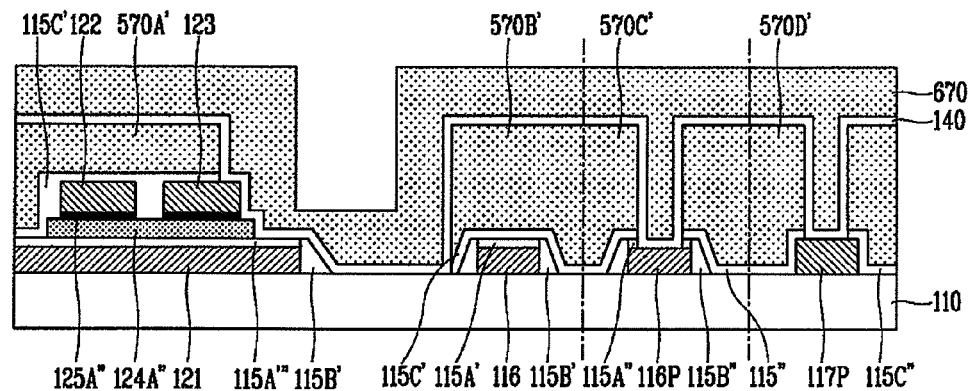
Figure 9G:
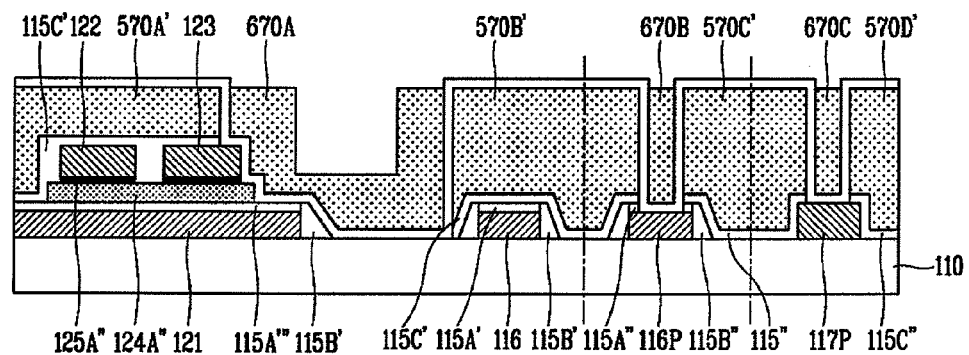
Figure 9H:
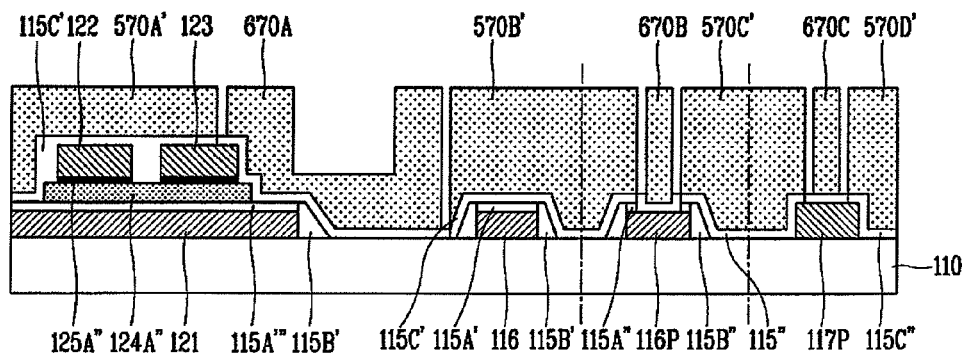
Figure 9I:
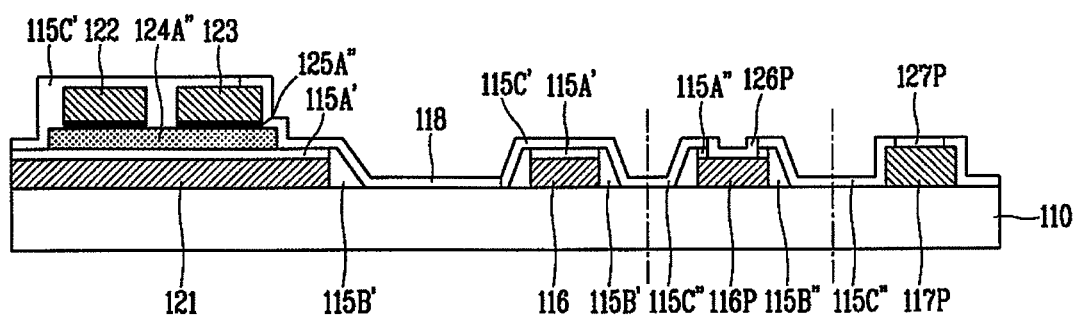

Since the process shown in FIGS. 9F-9H is similar to the process shown in FIGS. 8F-8I, the detailed descriptions will not be repeated here.

In the illustrated embodiments, the amorphous silicon TFT using the amorphous silicon thin film as the channel layer is taken as an example. However, the present invention is not limited thereto and a polycrystalline silicon TFT using a polycrystalline silicon thin film as the channel layer can be also used.

In addition, the present invention can be also applied to a different display device having the TFTs, for example, an organic light emitting diode (OLED) display device in which an OLED is connected with a different driving transistor, as well as to the LCD.

Furthermore, although the illustrated embodiments use a single mask in each of the three masking processes, it should be noted that using a single mask in one of the three masking processes and multiple masks in the other of the three masking processes still fall with the scope of the present invention.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A liquid crystal display (LCD) comprising:
a first substrate having a pixel portion and a pad portion;
a gate electrode, a gate line and a data line on the surface of the first substrate, wherein the gate line and the data line are crossing each other to define the pixel portion;
a gate insulation film on top surfaces of the gate electrode and the gate line;
a lateral insulating sidewall covering lateral sides of the gate electrode, the gate line and the data line without extending into the pixel portion;
an active layer on the gate insulating film except for the lateral insulating sidewall, wherein the active layer is free of contacting with the lateral insulating sidewall;
a source electrode and a drain electrode on the active layer;
an insulating layer above the source electrode and the drain electrode, the insulating layer exposing a lateral side of the drain electrode;
a pixel electrode in contact with the lateral side of the drain electrode;
a second substrate attached to the first substrate; and
a liquid crystal layer between the first substrate and a second substrate.

2. The liquid crystal display of claim 1, wherein the pixel electrode is in contact with the first substrate.

3. The liquid crystal display of claim 1, wherein the pixel electrode is in contact with the gate insulating layer.

4. The liquid crystal display of claim 1, wherein the insulating layer and the pixel electrode are respectively in contact with a top surface of the drain, and the insulating layer and the pixel electrode on the top surface of the drain are substantially coplanar.

5. The liquid crystal display of claim 1, wherein the pixel electrode is in contact with the active layer.

6. The liquid crystal display of claim 1, further comprising an ohmic contact layer between the active layer and each of the source electrode and the drain electrode, the pixel electrode being in contact with the ohmic contact layer.

7. The liquid crystal display of claim 1, wherein the pixel electrode is in contact with the lateral insulating sidewall.

8. The liquid crystal display of claim 1, wherein the lateral insulating sidewall is an organic film.

9. The liquid crystal display of claim 1, wherein each of the source and drain electrode has a width narrower than the gate line.

10. The liquid crystal display of claim 1, wherein the pixel electrode is a substantially crystallized indium tin oxide (ITO) thin film.

11. The liquid crystal display of claim 1, further comprising:
   a gate pad line on the pad portion of the first substrate;
   a gate pad insulating layer on a top surface of the gate pad line;
   a gate pad electrode connected to the gate pad line; and
   a gate pad lateral insulating sidewall covering lateral sides of the gate pad line, the pad portion insulating layer being in contact with the gate pad lateral insulating sidewall.

12. The liquid crystal display of claim 11, further comprising a pad portion insulating layer on the pad portion, the pad portion insulating layer being above the gate pad insulating layer and in contact with the gate pad insulating layer and the gate pad electrode.

13. The liquid crystal display of claim 1, further comprising:
   a data pad line on the pad portion of the first substrate;
   a pad portion insulating layer on the data pad line; and
   a data pad electrode connected to the data pad line;
   wherein the pad portion insulating layer above the data pad line and the data pad electrode above the data pad line are substantially coplanar.

14. The liquid crystal display of claim 13, wherein the data pad line is in contact with the first substrate.

15. The liquid crystal display of claim 14, wherein the data pad line is free of contacting with the gate insulating layer.

16. A liquid crystal display (LCD) comprising:
   a first substrate having a pixel portion and a pad portion;
   a gate electrode, a gate line and a data line on the surface of the first substrate, wherein the gate line and the data line are crossing each other to define the pixel portion;
   a gate insulation film on top surfaces of the gate electrode and the gate line;
   a lateral insulating sidewall covering lateral sides of the gate electrode and the gate line;
   an active layer on the gate insulating film except for the lateral insulating sidewall, wherein the active layer is free of contacting with the lateral insulating sidewall;
   a source electrode and a drain electrode on the active layer;
   an insulating layer above the source electrode and the drain electrode, the insulating layer exposing a lateral side of the drain electrode;
   a pixel electrode in contact with the lateral side of the drain electrode;
   a second substrate attached to the first substrate;
   a liquid crystal layer between the first substrate and a second substrate;
   a gate pad line on the pad portion of the first substrate;
   a gate pad insulating layer on a top surface of the gate pad line;
   a gate pad electrode connected to the gate pad line;
   a gate pad lateral insulating sidewall covering lateral sides of the gate pad line, the pad portion insulating layer being in contact with the gate pad lateral insulating sidewall; and
   a pad portion insulating layer on the pad portion, the pad portion insulating layer being above the gate pad insulating layer and in contact with the gate pad insulating layer and the gate pad electrode.

* * * * *